(12) United States Patent
Cripe et al.

(10) Patent No.: US 9,473,080 B1
(45) Date of Patent: Oct. 18, 2016

(54) PHOTOCONDUCTIVE SEMICONDUCTOR AMPLIFIER AND SWITCH

(71) Applicants: David W. Cripe, Mount Vernon, IA (US); Scott L. Patten, Marion, IA (US); Chenggang Xie, Marion, IA (US); Don L. Landt, Palo, IA (US)

(72) Inventors: David W. Cripe, Mount Vernon, IA (US); Scott L. Patten, Marion, IA (US); Chenggang Xie, Marion, IA (US); Don L. Landt, Palo, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 108 days.

(21) Appl. No.: 14/172,107

(22) Filed: Feb. 4, 2014

(51) Int. Cl.
*H03F 3/08* (2006.01)
*H03G 1/00* (2006.01)

(52) U.S. Cl.
CPC ............ *H03F 3/08* (2013.01); *H03F 3/085* (2013.01); *H03G 1/0047* (2013.01)

(58) Field of Classification Search
CPC .... H03F 1/52; H03F 3/45071; H03F 1/0205; H03F 2200/451; H03F 3/08; H03F 3/193; H03F 1/30; H03F 1/523; H03F 2200/129; H03F 2200/426; H03F 2200/471; H03F 2203/45112; H03F 2203/45116
USPC .......... 330/59, 207 A, 251, 308; 257/214 A, 257/214 AG
See application file for complete search history.

(56) References Cited

U.S. PATENT DOCUMENTS

| | | | | |
|---|---|---|---|---|
| 5,355,242 A | * | 10/1994 | Eastmond | H04B 10/114 250/214 A |
| 6,118,336 A | * | 9/2000 | Pullen | H03F 1/305 330/10 |
| 6,444,970 B1 | * | 9/2002 | Barbato | A61B 5/0075 250/214 A |
| 6,838,654 B2 | * | 1/2005 | Kuo | G01D 5/36 250/214 A |
| 7,400,191 B2 | * | 7/2008 | Rodriguez | H03F 1/34 330/10 |
| 2012/0250366 A1 | * | 10/2012 | Wang | H02M 3/33523 363/21.15 |

\* cited by examiner

*Primary Examiner* — Khanh V Nguyen
(74) *Attorney, Agent, or Firm* — Angel N. Gerdzhikov; Donna P. Suchy; Daniel M. Barbieri

(57) ABSTRACT

A switch comprises two photoconductive semiconductors and two corresponding laser diodes driven by opposing voltage sources. The two photoconductive semiconductors are connected in series between a high and low voltage source with a radio frequency output at a center node between the photoconductive semiconductors. Each photoconductive semiconductor may include one ohmic contact and one schottky contact for superior bandwidth and efficiency.

16 Claims, 2 Drawing Sheets

PHOTOCONDUCTIVE SEMICONDUCTOR AMPLIFIER AND SWITCH

FIELD OF THE INVENTION

The present invention is directed generally toward photoconductive semiconductor switches, and more particularly toward

BACKGROUND OF THE INVENTION

Limitations in modulating bandwidth and efficiency in radio frequency (RF) power amplifiers prevent reductions in size, weight, power and cooling. Class-D power amplifiers offer the highest theoretical efficiency and bandwidth of known power amplifiers. The necessity of driving a floating, high side switch has hindered their widespread implementation.

Switching power converters utilizing power switching devices in a half-bridge or full-bridge configuration are commonly operated in conditions where the active devices pass reverse current. In many cases, a schottky diode is placed in parallel with each active device to permit conduction of reverse current in a path other than the main switching devices. These schottky diodes add parasitic capacitance and inductance.

Consequently, it would be advantageous if an apparatus existed that is suitable for power switching without complicated drive circuitry.

SUMMARY OF THE INVENTION

Accordingly, the present invention is directed to a novel apparatus for power switching without complicated drive circuitry.

In at least one embodiment, a switch comprises two photoconductive semiconductors and two corresponding laser diodes driven by opposing voltage sources. The two photoconductive semiconductors are connected in series between a high and low voltage source with a radio frequency output at a center node between the photoconductive semiconductors.

In another embodiment, a photoconductive semiconductor based switch includes two photoconductive semiconductors, each having one ohmic contact and one schottky contact. Such a switch exhibits superior bandwidth and efficiency.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
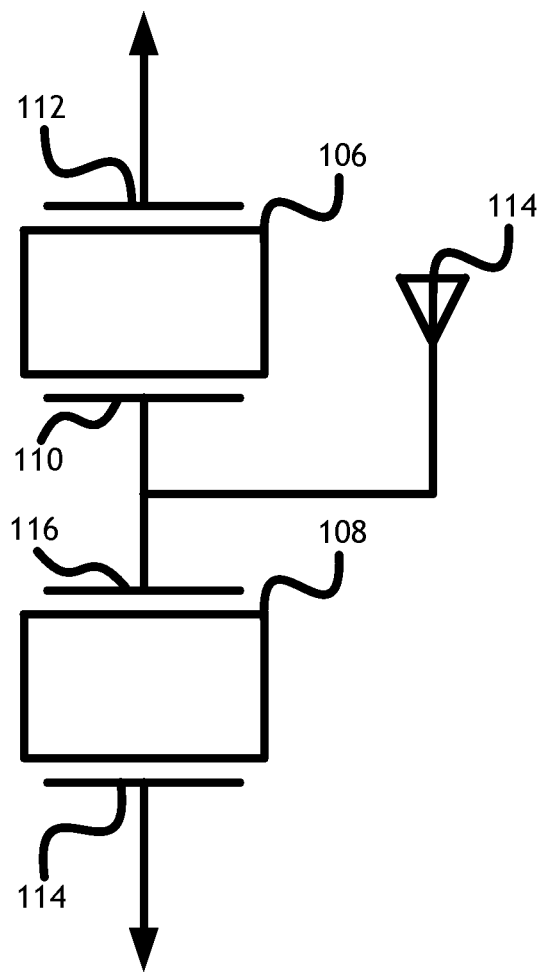
FIG. 1 shows a photoconductive semiconductor based amplifier according to one embodiment of the present invention.

Referring to FIG. 1, a photoconductive semiconductor based amplifier according to one embodiment of the present invention is shown. In at least one embodiment of the present invention, a photoconductive semiconductor switch device comprises a first photoconductive semiconductor element 106 and a second photoconductive semiconductor element 108. The first photoconductive semiconductor element 106 has a source 112 comprising a schottky contact and a drain 110 comprising an ohmic contact. The second photoconductive semiconductor element 108 has a source 114 comprising a schottky contact and a drain 116 comprising an ohmic contact. The combination of schottky contacts and ohmic contacts produces photoconductive semiconductor switch having inherent schottky diode characteristics. The node defined by the second photoconductive semiconductor element 108 drain 116 and the second photoconductive semiconductor element 108 drain 116 comprises an RF output 114.

Photoconductive Semiconductor Switches are active semiconductor devices fabricated of semiconductor materials separating two electrodes. Application of light causes creation of free electrons in the semiconductor medium, permitting electron flow between the electrodes; devices have been fabricated capable of switching kilovolts and kiloamps in picoseconds. A photoconductive semiconductor switch having inherent schottky diode characteristics offers superior size, weight, power and cooling characteristics. Where the device is fabricated of doped semiconductor material with one ohmic and one schottky contact, the device may be forward biased to conduct as a schottky rectifier. When reversed biased, a depletion region forms beneath the schottky contact. Application of light with wavelength corresponding to the bandgap energy of the semiconductor material creates free electrons which causes conduction through the depletion region.

A person of ordinary skill in the art may appreciate that more than two photoconductive semiconductor elements 106, 108 may be combined and a device may comprise a plurality of photoconductive semiconductor switches.

Figure 2:
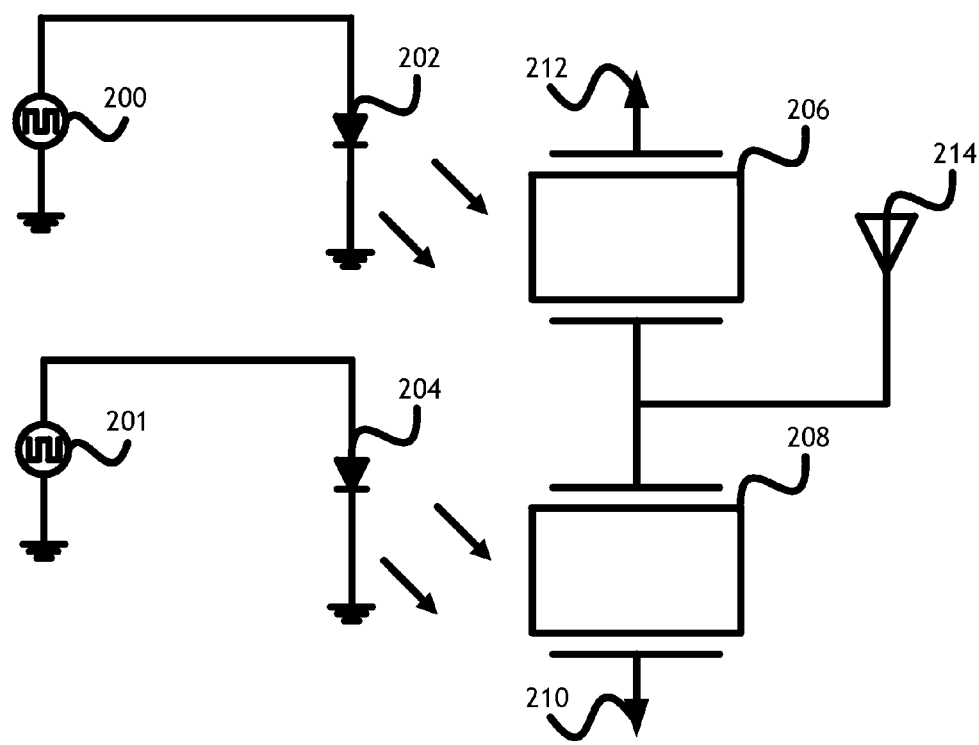
FIG. 2 shows a switch according to one embodiment of the present invention.

Referring to FIG. 2, a switch according to one embodiment of the present invention is shown. In at least one embodiment, a photoconductive semiconductor amplifier is configured as a voltage switching half-bridge. The photoconductive semiconductor switch may include two light emitting diodes 202, 204 such as laser diodes, each directed toward photoconductive semiconductor elements 206, 208.

In at least one embodiment, the photoconductive semiconductor elements 206, 208 are organized in series such that a first photoconductive semiconductor element 206 is bounded by a terminal connected to a positive voltage source 212 and a terminal connected to a midpoint. A second photoconductive semiconductor element 208 is bounded by a terminal connected to the same midpoint and a terminal connected to a negative voltage source 210. An RF output 214, such as an antenna, is connected to the midpoint. The photoconductive semiconductor elements 206, 208 may comprise an amplifier.

Laser light from a first laser diode 202 drives the semiconductive state of the first photoconductive semiconductor element 206, and thereby controls current flow from the positive voltage source 212 to the RF output 214. Likewise, laser light from a second laser diode 204 drives the semiconductive state of the second photoconductive semiconductor element 208, and thereby controls current flow from the negative voltage source 210 to the RF output 214.

Where the first laser diode 202 is driven by a first signal source 200 and the second laser diode 204 is driven by a second signal source 201, the first signal source 200 and second signal source 201 may be offset by a certain phase such that the laser diodes 202, 204 drive the photoconductive semiconductor elements 206, 208 to produce a desirable RF signal at the midpoint. A switch according to at least one embodiment of the present invention is driven by pulsed laser sources which cause the photoconductive semiconductor elements 206, 208 to conduct alternately, creating a voltage output waveform.

Devices according to at least one embodiment of the present invention may be switched at the carrier rate to create a continuous wave RF signal, or pulse-width modulated at a rate higher than that of the RF output frequency to create a synthesized waveform. Additionally, multiple devices may be stacked to obtain higher voltage operation, or multiple-voltage stepped waveforms.

Because the activation of photoconductive semiconductor devices is through illumination by a light source, there is an intrinsic electrical isolation between the switch driving means and the switch itself. This permits the implementation of power amplifier topologies utilizing non-ground-referenced power devices. The preferred implementation of the photoconductive semiconductor based amplifier is a Class-D half-bridge. A photoconductive semiconductor based Class-D power amplifier exhibits superior bandwidth and efficiency over conventional power amplifier technologies.

A class-D half-bridge having two or more photoconductive semiconductor switches allows the implementation of highly efficient RF power amplification with high potential modulation bandwidth. The photoconductive semiconductor elements 206, 208 being actuated by illumination with laser diodes 202, 204 supplants the need for complex drive circuitry required by other RF power devices, greatly simplifying their implementation. Because of the switching speed and efficiency of embodiments of the present invention, power amplification is possible for signals having extremely high frequencies. Some embodiments of the present invention may be useful for amplifying signals with frequencies of ten gigahertz or more.

It is believed that the present invention and many of its attendant advantages will be understood by the foregoing description of embodiments of the present invention, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A power amplifier comprising:
a first photoconductive semiconductor element;
a first laser source configured to drive the semiconductive state of the first photoconductive semiconductor element;
a second photoconductive semiconductor element; and
a second laser source configured to drive the semiconductive state of the first photoconductive semiconductor element,
wherein a drain of the first photoconductive semiconductor element and a drain of the second photoconductive semiconductor element are connected.

2. The power amplifier of claim 1, further comprising:
a first signal source configured to drive the first laser source; and
a second signal source configured to drive the second laser source.

3. The power amplifier of claim 2, wherein the first signal source and the second signal source are configured to produce substantially identical signals having a phase offset.

4. The power amplifier of claim 3, wherein the first signal source, the second signal source and the phase offset define a desired radio frequency signal.

5. The power amplifier of claim 1, wherein:
the first photoconductive semiconductor element comprises a schottky contact and an ohmic contact; and
the second photoconductive semiconductor element comprises a schottky contact and an ohmic contact.

6. The power amplifier of claim 5, wherein:
the schottky contact of the first photoconductive semiconductor element comprises a source node; and
the schottky contact of the second photoconductive semiconductor element comprises a source node.

7. The power amplifier of claim 1, wherein the first photoconductive semiconductor element and the second photoconductive semiconductor element are arranged as a class-D amplifier.

8. The power amplifier of claim 1, wherein the power amplifier is configured to produce amplified signals having a frequency of at least ten gigahertz.

9. A radio frequency switch comprising:
a first photoconductive semiconductor element having a schottky contact and an ohmic contact; and
a second photoconductive semiconductor element having a schottky contact and an ohmic contact,
wherein a drain node of the first photoconductive semiconductor element and a drain node of the second photoconductive semiconductor element define a radio frequency output.

10. The radio frequency switch of claim 9, wherein:
the schottky contact of the first photoconductive semiconductor element comprises a source node; and
the schottky contact of the second photoconductive semiconductor element comprises a source node.

11. The radio frequency switch of claim 10, further comprising:
a first laser source configured to drive the semiconductive state of the first photoconductive semiconductor element; and
a second laser source configured to drive the semiconductive state of the first photoconductive semiconductor element.

12. The radio frequency switch of claim 11, further comprising:
a first signal source configured to drive the first laser source; and
a second signal source configured to drive the second laser source.

13. The radio frequency switch of claim 12, wherein the first signal source and the second signal source are configured to produce substantially identical signals having a phase offset.

14. The radio frequency switch of claim 13, wherein the first signal source, the second signal source and the phase offset define a desired radio frequency signal.

15. The radio frequency switch of claim 13, wherein each of the first signal course and second signal source are pulse-width modulated at a rate higher than the frequency of an output signal to create a synthesized waveform.

16. The radio frequency switch of claim 9, wherein the radio frequency switch is configured to produce amplified signals having a frequency of at least ten gigahertz.

* * * * *